US011610794B2

(12) United States Patent
Reuter et al.

(10) Patent No.: US 11,610,794 B2
(45) Date of Patent: *Mar. 21, 2023

(54) SIDE STORAGE PODS, EQUIPMENT FRONT END MODULES, AND METHODS FOR OPERATING THE SAME

(71) Applicant: APPLIED MATERIALS, INC., Santa Clara, CA (US)

(72) Inventors: Paul Reuter, Austin, TX (US); Dean C. Hruzek, Cedar Park, TX (US); Nir Merry, Mountain View, CA (US); John C. Menk, Round Rock, TX (US); Douglas B. Baumgarten, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 547 days.

This patent is subject to a terminal disclaimer.

(21) Appl. No.: 16/656,191

(22) Filed: Oct. 17, 2019

(65) Prior Publication Data

US 2020/0135520 A1 Apr. 30, 2020

Related U.S. Application Data

(60) Provisional application No. 62/751,519, filed on Oct. 26, 2018.

(51) Int. Cl.
*H01L 21/673* (2006.01)
*H01L 21/67* (2006.01)
*B01D 53/04* (2006.01)

(52) U.S. Cl.
CPC .... *H01L 21/67389* (2013.01); *B01D 53/0446* (2013.01); *H01L 21/67017* (2013.01); *B01D 2253/102* (2013.01); *B01D 2259/4525* (2013.01)

(58) Field of Classification Search
CPC .... B01D 53/04; B01D 53/0446; B01D 53/40; B01D 53/82; B01D 2253/102;
(Continued)

(56) References Cited

U.S. PATENT DOCUMENTS 6,758,876 B2 * 7/2004 Suzuki ............. H01L 21/67393
454/192
6,996,453 B2 * 2/2006 Ahn ........................ H01L 21/00
414/217
(Continued)

FOREIGN PATENT DOCUMENTS

KR 20040064326 A 7/2004
KR 101215962 B1 12/2012
(Continued)

OTHER PUBLICATIONS

PCT International Search Report and Written Opinion for International Application No. PCT/US2019/057286, dated Mar. 25, 2020, 11 pages.

*Primary Examiner* — Frank M Lawrence, Jr.
(74) *Attorney, Agent, or Firm* — Lowenstein Sandler LLP (57) ABSTRACT

Electronic device processing assemblies including an equipment front end module (EFEM) with at least one side storage pod attached thereto are described. The side storage pod has a side storage container. In some embodiments, an exhaust conduit extends between the chamber and a pod plenum that can contain a chemical filter proximate thereto. A supplemental fan may draw purge gas from the pod plenum through the chemical filter and route the gas through a return duct to an upper plenum of the EFEM. Methods and side storage pods in accordance with these and other embodiments are also disclosed.

20 Claims, 7 Drawing Sheets

(58) Field of Classification Search
CPC .... B01D 2258/0216; B01D 2259/4525; H01L 21/67017; H01L 21/67196; H01L 21/67389; H01L 21/67393
USPC .................................................. 95/90; 96/108
See application file for complete search history.

(56) References Cited

U.S. PATENT DOCUMENTS

| | | | |
|---|---|---|---|
| 9,272,315 B2* | 3/2016 | Chou | B01D 46/442 |
| 10,359,743 B2* | 7/2019 | Rice | H01L 21/67775 |
| 11,189,511 B2* | 11/2021 | Reuter | H01L 21/67126 |
| 11,244,844 B2* | 2/2022 | Reuter | H01L 21/67769 |
| 2001/0021357 A1* | 9/2001 | Wang | B01D 53/18 |
| | | | 95/82 |
| 2015/0228518 A1 | 8/2015 | Hyon | |
| 2016/0379855 A1* | 12/2016 | Fukasawa | H01L 21/67769 |
| | | | 414/217 |
| 2017/0170042 A1* | 6/2017 | Okabe | H01L 21/67393 |
| 2020/0135499 A1* | 4/2020 | Pannese | B01D 46/0039 |
| 2020/0135523 A1* | 4/2020 | Reuter | H01L 21/67766 |

FOREIGN PATENT DOCUMENTS

| | | |
|---|---|---|
| KR | 101682473 B1 | 12/2016 |
| KR | 20180074276 A | 7/2018 |

* cited by examiner

SIDE STORAGE PODS, EQUIPMENT FRONT END MODULES, AND METHODS FOR OPERATING THE SAME

RELATED APPLICATIONS

This application claims the benefit under 35 U.S.C. § 119(e) of U.S. Provisional Patent Application No. 62/751,519, filed Oct. 26, 2018, which is incorporated herein, in its entirety, by this reference.

TECHNICAL FIELD

The present disclosure relates to electronic device manufacturing, and more specifically to equipment front end modules, side storage pods, and methods for operating the same.

BACKGROUND

Electronic device manufacturing systems may include multiple process chambers arranged around a mainframe housing having a transfer chamber and one or more load lock chambers configured to pass substrates into the transfer chamber.

Processing of substrates in semi-conductor component manufacturing may be carried out in multiple tools, where the substrates travel between the tools in substrate carriers such as front end unified pods (FOUPs). Exposure of the substrates to certain environmental conditions during processing may degrade the substrates. For example, exposure to humidity during processing of substrates may degrade chip components fabricated on the substrates.

Accordingly, improved assemblies, apparatus, and methods for controlling the environmental conditions of substrates during processing are desired.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing may involve exposing substrates to different chemicals during a plurality of processes. In between different processes being applied to the substrates, the substrates may undergo outgassing. Some processes applied to the substrates may cause the substrates to outgas corrosive chemicals, such as fluorine, bromine, and/or chlorine. If these chemical components are not removed from the environment and the substrates, the gasses may cause defects on the substrates.

According to one or more embodiments of the disclosure, electronic device processing assemblies and methods adapted to improve substrate processing are provided. The apparatus, assemblies, and methods described herein may provide efficiency and/or processing improvements in the processing of substrates by controlling environmental exposure to the substrates, and, in particular, conditions within one or more side storage pods coupled to a body of an equipment front end module (hereinafter "EFEM"). One or more side storage containers may be configured to be receivable within a side storage pod and may include substrate holders (e.g., shelves) that receive and support substrates, such as during idle periods before and/or after processes are applied to the substrates.

Purge gas may flow from the EFEM chamber into a side storage container where the purge gas flows past substrates located therein. In some embodiments, the purge gas may be exhausted from the rear of the side storage container and passed through a chemical filter. The filtered gas may then be recirculated into the EFEM chamber. In some embodiments, the recirculation path of the gas may pass through an access door to the EFEM, which may reduce and/or minimize the space occupied by the recirculation path. Such a side storage container configuration may reduce harmful effects of substrate outgassing within the side storage container because the purge gas recirculated into the EFEM chamber from the side storage container is filtered by the chemical filter (e.g., removing unwanted chemicals). In addition, the substrates are exposed to a controlled gas environment within the EFEM, which may be relatively dry and/or have relatively low $O_2$ levels.

Further details of example embodiments of side storage pods, electronic device processing assemblies, apparatus such as EFEMs including a side storage pod, and methods of operating EFEMs are described with reference to FIGS. 1-7 herein.

Figure 1:
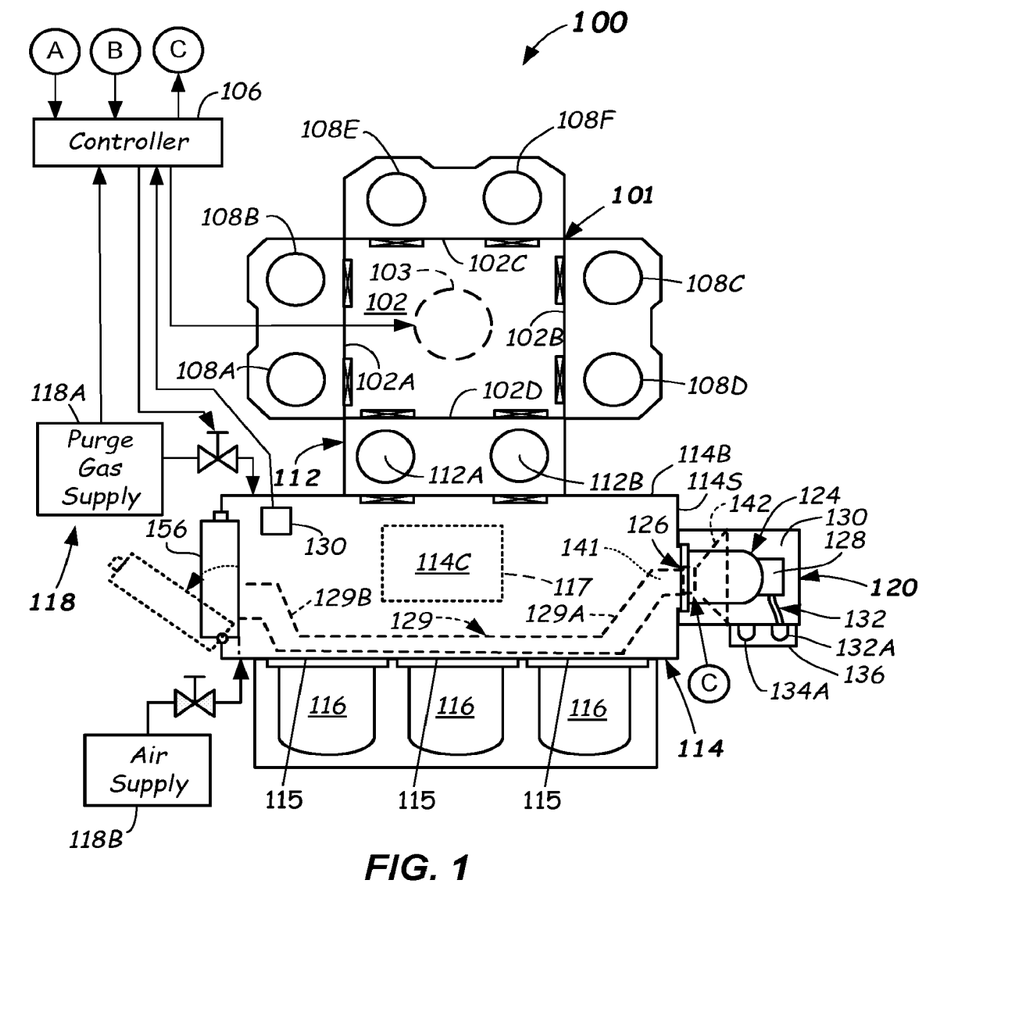
FIG. 1 illustrates a schematic top view of an electronic device processing assembly including a side storage pod according to one or more embodiments of the disclosure.

FIG. 1 illustrates a schematic diagram of an example embodiment of an electronic device processing assembly 100 according to one or more embodiments of the present disclosure. The electronic device processing assembly 100 may include a mainframe housing 101 having housing walls defining a transfer chamber 102. A transfer robot 103 (shown as a dotted circle) may be at least partially housed within the transfer chamber 102. The transfer robot 103 may be configured to place and extract substrates to and from destinations via operation of arms (not shown) of the transfer robot 103. Substrates as used herein may mean articles used to make electronic devices or circuit components, such as semiconductor wafers, silicon-containing wafers, patterned or un-patterned wafers, glass plates, masks, or the like.

The motion of the various arm components of the transfer robot 103 may be controlled by suitable commands to a drive assembly (not shown) containing a plurality of drive motors of the transfer robot 103 as commanded from a controller 106. Signals from the controller 106 may cause motion of the various components of the transfer robot 103. Suitable feedback mechanisms may be provided for one or more of the components by various sensors, such as position encoders, or the like.

In the embodiments shown in FIG. 1, the transfer chamber 102 in the depicted embodiment may be square or slightly rectangular in shape. However, other shapes are possible, such as hexagonal, octagonal, and the like. Transfer chamber 102 may include a first facet 102A, second facet 102B opposite the first facet 102A, a third facet 102C, and a fourth facet 102D opposite the third facet 102C. In some embodiments, the transfer robot 103 may be adept at transferring dual substrates at the same time to and from process chamber sets. The first facet 102A, second facet 102B, third facet 102C, and fourth facet 102D may be planar and entryways into the chamber sets that may lie along the respective facets, for example. However, other suitable shapes of the mainframe housing 101, transfer chamber 102, and/or facets 102A-102D, and/or other numbers of facets and/or process chambers are possible.

The destinations for the transfer robot 103 may be a first process chamber set 108A, 108B, coupled to the first facet 102A and which may be configured and operable to carry out a process on the substrates delivered thereto. The process may be any suitable process such as plasma vapor deposition (PVD) or chemical vapor deposition (CVD), etch, annealing, pre-clean, metal or metal oxide removal, or the like. Other processes may be carried out on substrates therein.

The destinations for the transfer robot 103 may also be a second process chamber set 108C, 108D that may be opposed from the first process chamber set 108A, 108B. The second process chamber set 108C, 108D may be coupled to the second facet 102B and may be configured to carry out any suitable process on the substrates, such as any of the processes mentioned above. Likewise, the destinations for the transfer robot 103 may also be a third process chamber set 108E, 108F coupled to the third facet 102C that may be opposed from a load lock apparatus 112. The third process chamber set 108E, 108F may be configured to carry out any suitable process on the substrates, such as any of the processes mentioned above.

Substrates may be received into the transfer chamber 102 from an EFEM 114, and also exit the transfer chamber 102, to the EFEM 114, through the load lock apparatus 112 that is coupled to a wall (e.g., a rear wall) of a body 114B of the EFEM 114. The load lock apparatus 112 may include one or more load lock chambers (e.g., load lock chambers 112A, 112B, for example). Load lock chambers 112A, 112B that are included in the load lock apparatus 112 may be single wafer load locks (SWLL) chambers, multi-wafer chambers, or combinations thereof, for example.

In some embodiments, the EFEM 114 may include a EFEM body 114B comprising an enclosure having walls (such as a front wall, a rear wall, and side walls, a top wall, and a bottom wall, for example) forming an EFEM chamber 114C. One or more load ports may be provided in a wall (e.g., front wall) of the EFEM body 114B and may be configured to receive and dock one or more substrate carriers 116 (e.g., FOUPs) thereat. Three substrate carriers 116 are shown, but more or less numbers of substrate carriers 116 may be docked with the EFEM 114.

EFEM 114 may include a suitable load/unload robot 117 (shown dotted) of conventional construction within the EFEM chamber 114C thereof. The load/unload robot 117 may be configured and operational, once a door of a substrate carrier 116 is opened, to extract substrates from the substrate carrier 116 and feed the substrates through the EFEM chamber 114C and into the one or more load lock chambers 112A, 112B of the load lock apparatus 112.

The load/unload robot 117 also may be configured and operational, once the door of a substrate carrier 116 is opened, to extract substrates from the substrate carrier 116 and feed the substrates into a side storage pod 120 while the substrates sit idle awaiting processing. In some embodiments, the side storage pod 120 may be coupled to a side wall 114S of the EFEM body 114B. The load/unload robot 117 may further be configured to extract substrates from and load substrates into the side storage pod 120 prior to and/or after processing in one or more of the process chambers 108A-108F. In some embodiments, the load/unload robot 117 may be a high-Z robot configured to access substrates stacked greater than 26 high, or even fifty-two high or higher, in the side storage pod 120.

Figure 4:
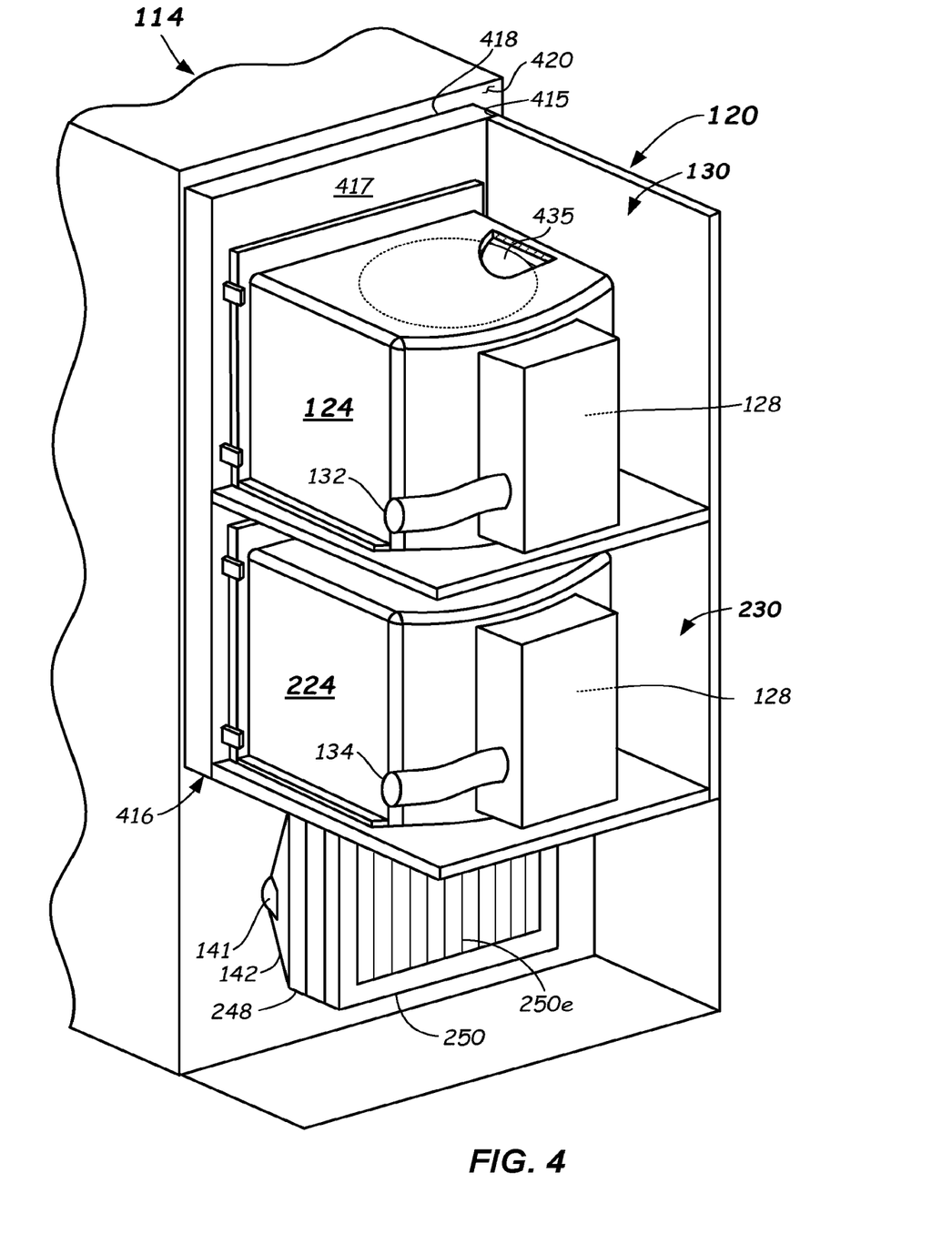
FIG. 4 illustrates a partial isometric view of a side storage pod coupled to the body of the EFEM with a side wall, a top wall, and doors of the side storage pod removed according to one or more embodiments of the disclosure.

In the depicted embodiment, the EFEM chamber 114C may be provided with environmental controls providing an environmentally-controlled atmosphere therein. In particular, an environmental control apparatus 118 may be coupled to the EFEM 114 and may be operational to monitor and/or control environmental conditions within the EFEM chamber 114C. In some embodiments, and at certain times, the EFEM chamber 114C may receive a purge gas (e.g., inert and/or non-reactive gas) therein, such as argon (Ar), nitrogen ($N_2$), or helium (He), from a purge gas supply 118A. In other embodiments, or at other times, air (e.g., dry filtered air) may be provided from an air supply 118B. In some embodiments, the environmental conditions within the EFEM chamber 114C may be present in the interiors of side storage containers 124 and 224 (FIG. 2) located within and part of the side storage pod 120. The side storage containers 124, 224 receive substrates such as substrates 435 (FIG. 4). In some embodiments, the side storage pod 120 may have substrate holders located therein to receive substrates 435 without the use of side storage containers.

In more detail, the environmental control apparatus 118 may control at least one of: 1) relative humidity (RH), 2) temperature (T), 3) an amount of $O_2$, and/or 4) an amount of purge gas, within the EFEM chamber 114C. Other environmental conditions of the EFEM 114 may be monitored and/or controlled, such as gas flow rate into the EFEM chamber 114C, or pressure in the EFEM chamber 114C, or both, or flow rate or pressure in the side storage pod 120 or conduits interconnected therewith.

In some embodiments, environmental control apparatus 118 includes the controller 106. Controller 106 may include suitable processor, memory, and electronic components for receiving inputs from various sensors and controlling one or more valves or fans to control the environmental conditions within the EFEM chamber 114C and the side storage pod 120. Environmental control apparatus 118 may, in one or more embodiments, monitor relative humidity (RH) by sensing RH in the EFEM chamber 114C with an environmental monitor 130. Any suitable type of environmental monitor 130 that measures relative humidity may be used, such as a capacitive-type sensor. The RH may be lowered by flow of a suitable amount of the purge gas from the purge gas supply 118A of the environmental control apparatus 118 into the EFEM chamber 114C. As described herein, the inert and/or non-reactive gas from the purge gas supply 118A may be argon, $N_2$, helium, another non-reactive gas, or mixtures thereof. In some embodiments, compressed bulk inert gases having low $H_2O$ levels (e.g., purity≥99.9995%, $H_2O$≤5 ppm) may be used as the purge gas supply 118A in the environmental control apparatus 118, for example. Other $H_2O$ levels may be used.

In another aspect, the environmental monitor 130 may measure a plurality of environmental conditions. For example, in some embodiments, the environmental monitor 130 may measure the relative humidity value as discussed above. In one or more embodiments, the pre-defined reference relative humidity value may be less than 1000 ppm moisture, less than 500 ppm moisture, or even less than 100 ppm moisture, depending upon the level of moisture that is tolerable for the particular process being carried out in the electronic device processing assembly 100 or particular substrates exposed to the environment of the EFEM chamber 114C.

The environmental monitor 130 may also measure a level of oxygen ($O_2$) within the EFEM 114. In some embodiments, a control signal from the controller 106 to the environmental control apparatus 118 initiating a flow of a suitable amount of the purge gas from the purge gas supply 118A into the EFEM chamber 114C may take place to control the level of oxygen ($O_2$) to below a threshold $O_2$ value. In one or more embodiments, the threshold $O_2$ value may be less than 50 ppm, less than 10 ppm, or even less than 5 ppm, depending upon the level of $O_2$ that is tolerable (not affecting quality) for the particular process being carried out in the electronic device processing assembly 100 or particular substrates exposed to the environment of the EFEM 114. In some embodiments, the environmental monitor 130 may sense the level of oxygen in the EFEM chamber 114C to ensure it is above a safe threshold level to allow entry into the EFEM chamber 114C.

The environmental monitor 130 may also measure the absolute or relative pressure within the EFEM 114. In some embodiments, the controller 106 may control the amount of flow of the purge gas from the purge gas supply 118A into the EFEM chamber 114C to control the pressure within the EFEM chamber 114C.

In some embodiments, the environmental control apparatus 118 of the electronic device processing assembly 100 may include an air supply 118B coupled to the EFEM 114. The air supply 118B may be coupled by suitable conduits and one or more valves to the EFEM chamber 114C. The air supply 118B can be used to purge the EFEM of the purge gas prior to servicing the EFEM 114.

In the depicted embodiments herein, the controller 106 may include a processor, memory, and peripheral components adapted to receive control inputs (e.g., relative humidity and/or oxygen, etc.) from the environmental monitor 130 and execute a closed loop or other suitable control scheme. In one embodiment, the control scheme may change a flow rate of the purge gas being introduced into the EFEM 114 to achieve a predetermined environmental condition therein. In another embodiment, the control scheme may determine when to transfer substrates into the EFEM chamber 114C.

The side storage pod 120 attached to the EFEM body 114B may store substrates under specific environmental conditions. For example, the side storage pod 120 may store the substrates in the same environmental conditions as are present in the EFEM chamber 114C, except for flow rate. In some embodiments, the side storage pod 120 may be fluidly coupled to the EFEM chamber 114C and may receive gas (e.g., purge gas) from the EFEM chamber 114C. The side storage pod 120 may include exhaust conduits 134A, 134B that exhaust gas from the side storage pod 120, which further enables the substrates stored in the side storage pod 120 to be constantly exposed to the desired environmental conditions.

A first side storage container 124 may be received in the side storage pod 120. A second side storage pod container 224 substantially identical to the first side storage container 124 may also be included in the side storage pod 120. The description of the first side storage container 124 is applicable to the second side storage pod container 224. In some embodiments, the side storage pod 120 may receive one or more vertically-aligned and/or stacked side storage containers 124, 224.

In more detail, the first side storage container 124 may include an opening 126 that faces and interfaces with the EFEM chamber 114C and an exhaust plenum 128 located opposite the opening 126. The exhaust plenum 128 may be coupled to the first exhaust conduit 132 that may couple to an exhaust duct 128 exterior to the side storage pod 120. Purge gas within the interior of the first side storage container 124 may be prevented from entering the interior 130 of the side storage pod 120 via appropriate seals.

In some embodiments, the first exhaust conduit 132 may include a first external exhaust conduit 134A. A second conduit 134 (only the external portion 134A shown in FIG. 1) may be coupled between a second side storage container (224 in FIG. 2) and the return duct 129. Both the first external exhaust conduit 132A and the second external exhaust conduit 134B may be located partially or fully within a cover 136. In some embodiments, the cover 136, rather than the first external exhaust conduit 132A and the second external exhaust conduit 134A may exhaust the exhaust gas from the side storage containers 124, 224. In other embodiments, the first external exhaust conduit 131A and the second external exhaust conduit 134A may pass through the interiors 130, 230 of the side storage pod 120.

Figure 2:
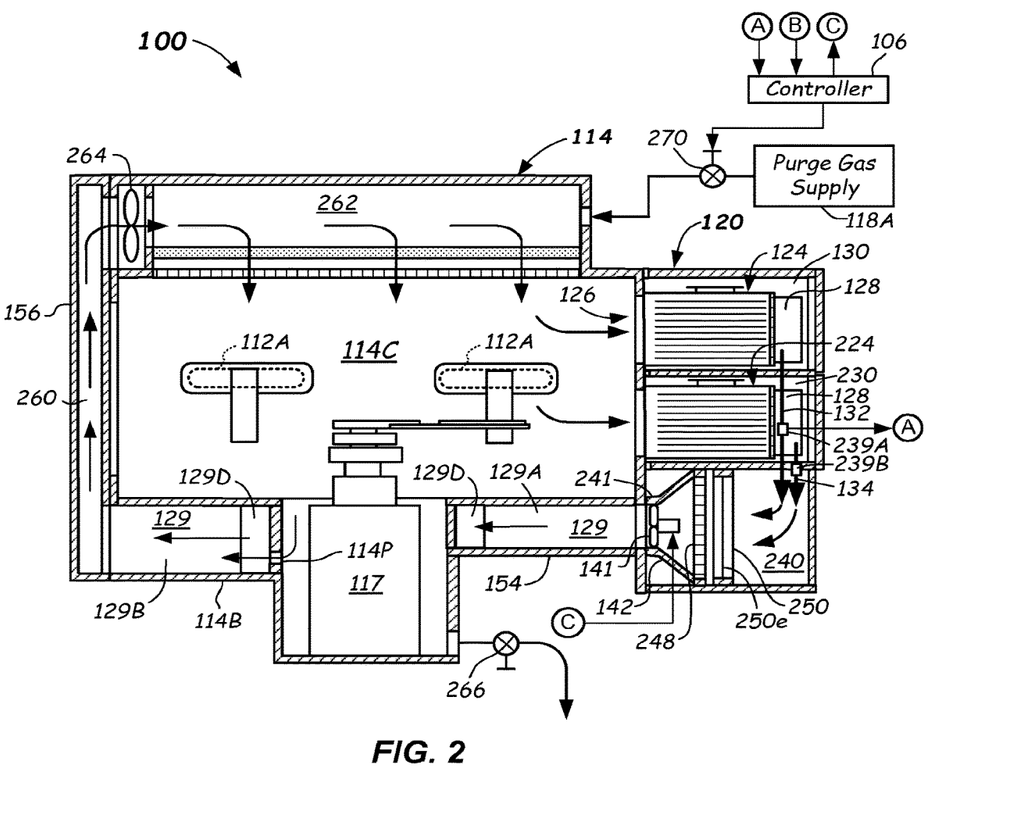
FIG. 2 illustrates a side, cross-sectional, elevation view of an equipment front end module (hereinafter "EFEM") including a side storage pod coupled to an EFEM body according to one or more embodiments of the disclosure.

Additional reference is made to FIG. 2, which illustrates a side, cross-sectional, elevation view of the EFEM 114 including the side storage pod 120 coupled to the EFEM body 114B. The side storage pod 120 may include the first chamber 130 that receives the first side storage container 124 and the second chamber 230 that receives a second side storage container 224.

Both the first external exhaust conduit 134A and the second external exhaust conduit 134A may be connected to a pod plenum 240 that receives the exhausted purge gas from the first side storage container 124 and the second side storage container 224. The plenum 240 may be attached to or be a portion of the side storage pod 120, for example. In some embodiments, the side storage pod 120 is removably attached to the EFEM body 114B. In one or more embodiments, purge gas may be drawn from the plenum 240 by a fan 264 located proximate to the upper plenum 262 of the EFEM 114. A supplemental fan 141 located, for example, in a plenum exhaust port 241 may supplement the purge gas flow through the side storage pod 120. Funnel 142 located between the supplemental fan 141 and the pod plenum 240 may direct the purge gas to the return duct 129, for example. Other configurations of the return duct 129 and pod plenum 240 are possible. In some embodiments, the gas flow through each of the side storage containers 124, 224 of the side storage pod 120 is greater than about 100 cfm, or from about 150 cfm to about 200 cfm (4.25 cmm to 5.0 cmm), or even from about 150 cfm to about 175 cfm (4.25-5.67 cmm), although other flows may be used. The high flow rate is thought to aid in disassociating unwanted chemical components (e.g., halogen containing components) from the substrates stored in the side storage containers 124, 224.

A filter 248 may be provided in the purge gas flow path generated by the fans 264, 140. For example, the filter 248 may be located proximate to the pod plenum 240 so that all the purge gas drawn into the pod plenum 240 passes through the filter 248. Other filter locations in the side storage pod 120 may be used. Optionally, the supplemental fan 141 may be provided in the portion of the return duct 129. In some embodiments, the filter 248 may be a chemical filter that filters one or more chemical components that are carried in the purge gas that have been outgassed by a substrate in the side storage pod 120 and/or in EFEM chamber 114C after application of a fabrication process thereto. In some embodiments, the filter 248 can operationally filter chlorine, bromine, and/or fluorine. In some embodiments, the filter 248 may filter base gasses, such as ammonia ($NH_3$) (e.g., to less than or equal to about 5.0 ppb or another target filter level). In some embodiments, the filter 248 may filter acidic gasses, such as fluorine (F), chlorine (Cl), bromine (Br), acetate (OAc), nitrogen dioxide ($NO_2$), nitrate ($NO_3$), phosphate ($PO_4$), hydrogen fluoride (HF), and hydrochloric acid (HCl) (e.g., to equal to or less than about 1.0 ppb or another target filter level). In some embodiments, the filter 248 may be an activated carbon filter. In other embodiments, the filter 248 may be a particulate filter or include a chemical filter and a particulate filter. The particulate filter is fine enough and operable to remove particles that may cause defects on the substrates.

In some embodiments, a heater 250 may be located in the gas flow generated by the fan 140. The heater 250 may heat the exhausted purge gas to a predetermined temperature as the exhaust gas is recirculated into the EFEM 114. In some embodiments, the heat generated by the heating elements 250e (e.g., resistive or infrared heating elements) of the heater 250 may be used as a reactant and/or to change the relative humidity in the EFEM 114 and/or the side storage pod 120. Further, the added heat may aid in improving the disassociation of chemical components from the substrates stored in the side storage pod 120. In some embodiments, the heater 250 may heat the purge gas to a temperature greater than or equal to 5° C. above ambient temperature outside of the EFEM 114, or even a temperature greater than or equal to 10° C. above ambient, or to a temperature from 5° C. above ambient to 25° C. above ambient in some embodiments.

The supplemental fan 140 may be operated to assist flow the purge gas (e.g., filtered gas) through return duct to the top of the EFEM 114 where it is recirculated back into the EFEM 114, and may be a variable speed fan enabling a desired flow rate through the side storage containers 124, 224 to be achieved.

Figure 3:
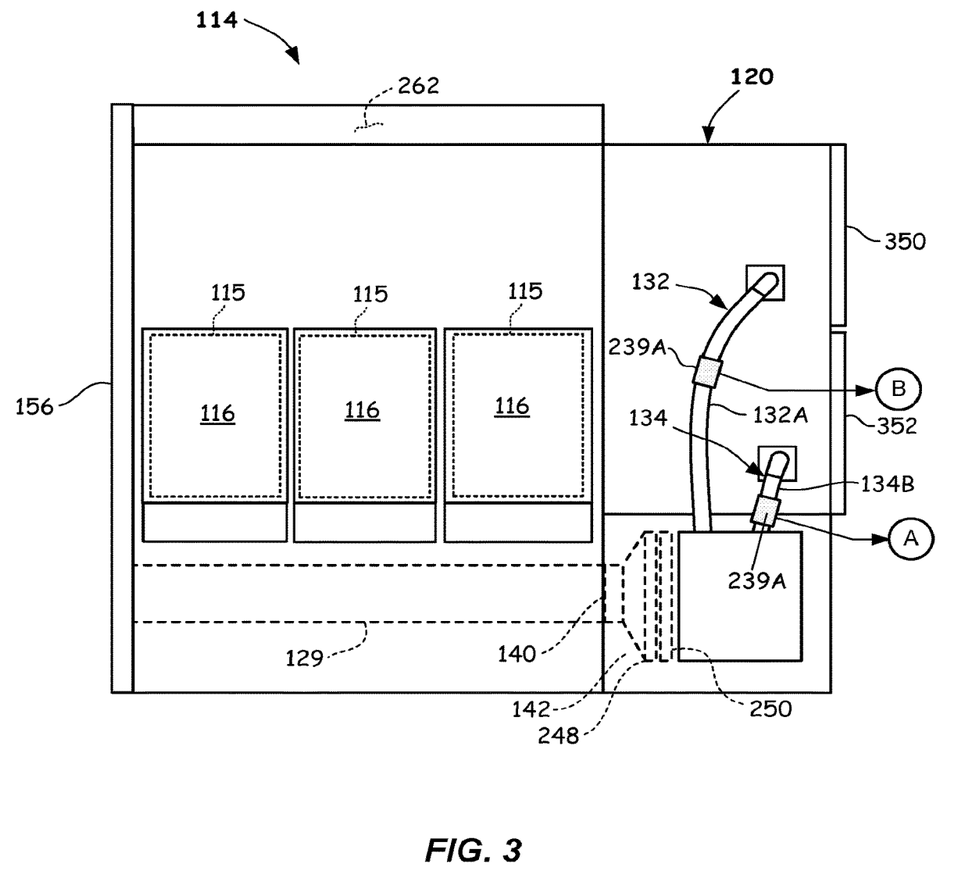
FIG. 3 illustrates a side view of an EFEM including a side storage pod according to one or more embodiments of the disclosure.

For example, as shown in FIGS. 2 and 3, one or both of the exhaust conduits 132, 134 can include along their length a suitable sensor 139A, 139B. The sensor 139A, 139B can be a flow sensor (such as a pitot or other tube sensor, a thermister, and the like) to enable a signal in lines labeled A and B to be sent to the controller 106. The controller 106 can then process the signals from A, B and send a control signal in control line labeled C to control the rotational speed of the supplemental fan 141 to achieve a desired flow rate through the side storage containers 124, 224. Any suitable control scheme can be used, such as Proportional-Integral-Derivative (PID) control. In some embodiments, the sensors 139A, 139B can be pressure sensors whose readings can be correlated to flow rate through the side storage containers 124, 224. Other suitable location for the sensors may be used, such as in the plenum 240, or in the return duct 129. In particular, the one or more sensors 139A, 139B can be located at any suitable location along an exhaust flow path from the one or more side storage containers 124, 224 where a good estimate of flow from the one or more side storage containers 124, 224 can be obtained.

In more detail, the recirculation of purge gas can flow through the return duct 129 that may extend between the funnel 142 and an access door 156 to the EFEM chamber 114C. In some embodiments, the return duct 129 may bend to fit through tight confines within the EFEM 114. For example, the return duct 129 may route around the load/unload robot 117 so as not to interfere with the operation of the load/unload robot 117. The return duct 129 may also route through the EFEM 114 in such a way as not to block operations associated with the substrate carriers 116, such as substrate carrier door openers (not shown). The return duct 129 may have a first section 129A that extends from the funnel 142 toward an opposed side of the EFEM 114. The first section 129A may, for example, direct the purge gas away from the plenum 240 and towards the robot 117. A second section 129B of the return duct 129 interconnected to the first section 129A through diversion portion 129D diverting around the robot 117 may extend toward the access door 156. The various sections may extend below load ports 115 associated with the substrate carriers 116, for example.

A return duct 129 may include duct section 260 that may extend through the access door 156. By extending the return duct 129 through the access door 156, the space occupied by the duct 129 is reduced and/or kept minimal. The duct portion 260 in the access door 156 may couple to an upper plenum 262 located on the top of the EFEM 114. The fan 264 may assist in forcing the purge gas from the return duct 129 into the upper plenum 262. In some embodiments, the upper plenum 262 may include or be coupled to outlets that cause a laminar gas flow through the EFEM chamber 114C and back into the side storage pod 120. Additional chemical and/or particulate filters may be located proximate to the plenum 262.

In some embodiments, a portion of the purge gas within EFEM chamber 11C may be exhausted from EFEM 114 through exhaust ports 114P. One exhaust ports 114P is shown, but there may be many exhaust ports for entry of purge gas into the return duct 129. In some embodiments, a small portion of the purge gas within EFEM chamber 114C may be exhausted from EFEM 114. For example, an exhaust valve 266 may be provided at a suitable location to exhaust a portion of gas from EFEM chamber 114C. In some embodiments, about 150 L/min of the gas may be exhausted from EFEM 114. Other amounts of gas may be exhausted.

In these or other embodiments, a source of supplement gas, such as from purge gas supply 118A, may be employed to provide additional purge gas to EFEM 114 to replace the gas that is exhausted through exhaust valve 266. For example, the same amount of gas exhausted by exhaust valve 266 may be introduced to upper plenum 262 using a gas flow valve 270. Other amounts of gas may be introduced. In some embodiments, exhaust valve 266 and/or gas flow valve 270 may be controlled by controller 106 or another controller. Purge gas supply 118A may include, for example, an inert and/or non-reactive gas such as Ar, $N_2$, He, or the like.

FIG. 3 illustrates a front elevation view of the EFEM 114 and a side elevation view of an embodiment the side storage pod 120. The side storage pod 120 depicted in FIG. 3 may include a first door 350 and a second door 352. The first door 350 and the second door 352 may form a seal with end portions of the side storage pod 120. For example, the first door 350 and the second door 352 may be hinge-type doors including hinges (not shown) or removable panel doors (e.g., screwed-on sealed panel doors) that enable access to the interiors 130, 230 of the side storage pod 120, yet sealing them when closed. In some embodiments, a single door may be used in place of the first door 350 and the second door 352. A suitable O-ring, gasket, or other seal on the first door 350 and the second door 352 or on the end portions may form hermetic seals of the side storage pod 120. In some embodiments, the first door 350 may form a first sealed compartment that is separated from and separately sealable from a second sealed compartment sealed by the second door 352. The first side storage container 124 may be received in the interior 130 of the first sealed compartment and the second side storage container 224 may be received in the interior 230 of the second sealed compartment 230. Other types of doors may be used to access the interiors 130, 230 of the side storage pod 120.

Additional reference is now made to FIG. 4, which illustrates a partial cut-away view of the side storage pod 120. The side storage pod 120 may have an interface side 415 located opposite the first door 350 and the second door 352. A panel 416 having a first side 417 and a second side 418 may be attached to the interface side 415 of the side storage pod 120. Specifically, the first side 417 of the panel 416 may be attached to the interface side 415 of the side storage pod 120. The second side 418 of the panel 416 may be attached to a surface 420 of a side wall of the EFEM body 114B located on the exterior of the EFEM 114. The panel 416 may form a hermetically-sealed interface between the interior of the EFEM chamber 114C and the interior of the side storage pod 120 as described below. In some embodiments, the panel 416 may be integrally formed with the side storage pod 120 or the EFEM 114. Other suitable connections to the EFEM body 114B may be used.

The first interior chamber 130 may include the first exhaust conduit 132 coupled to the first side storage container 124 and the second chamber 230 may include the second exhaust conduit 134 coupled to the second side storage container 224. The first exhaust conduit 132 may be coupled to external exhaust conduit portion 132A (FIGS. 1 and 3). The second exhaust conduit 134 may couple to the second external exhaust conduit portion 134A (FIGS. 1 and 3).

Other embodiments of side storage pods may include a larger number of chambers, such as three or more vertically-stacked chambers or side by side chambers, or both. In some embodiments, the side storage pod 120 may include a single chamber. As shown, plurality of substrates 435 are transferable between the first side storage container 124 and the EFEM chamber 114C and the second side storage container 224 and the EFEM 114. For example, the load/unload robot 117 may transfer substrates 435 between the EFEM chamber 114C and the first side storage container 124 and/or the second side storage container 224 before and/or after processing in the one or more process chambers 108A-108F (FIG. 1). In some embodiments, the first side storage container 124 and the second side storage container 224 may each receive twenty-six substrates 435. More or fewer substrate storage locations may be provided in each side storage container. The first side storage container 124 and the second side storage container 224 may maintain the substrates 435 under specific environmental conditions during their storage. For example, the substrates 435 may be exposed to the purge gas that is within the EFEM chamber 114C as described above. The environmental conditions may be controlled to provide exposure to less than preselected thresholds of water and/or $O_2$, or other conditions as specified above, and gas flow rate and/or temperature.

Figure 5:
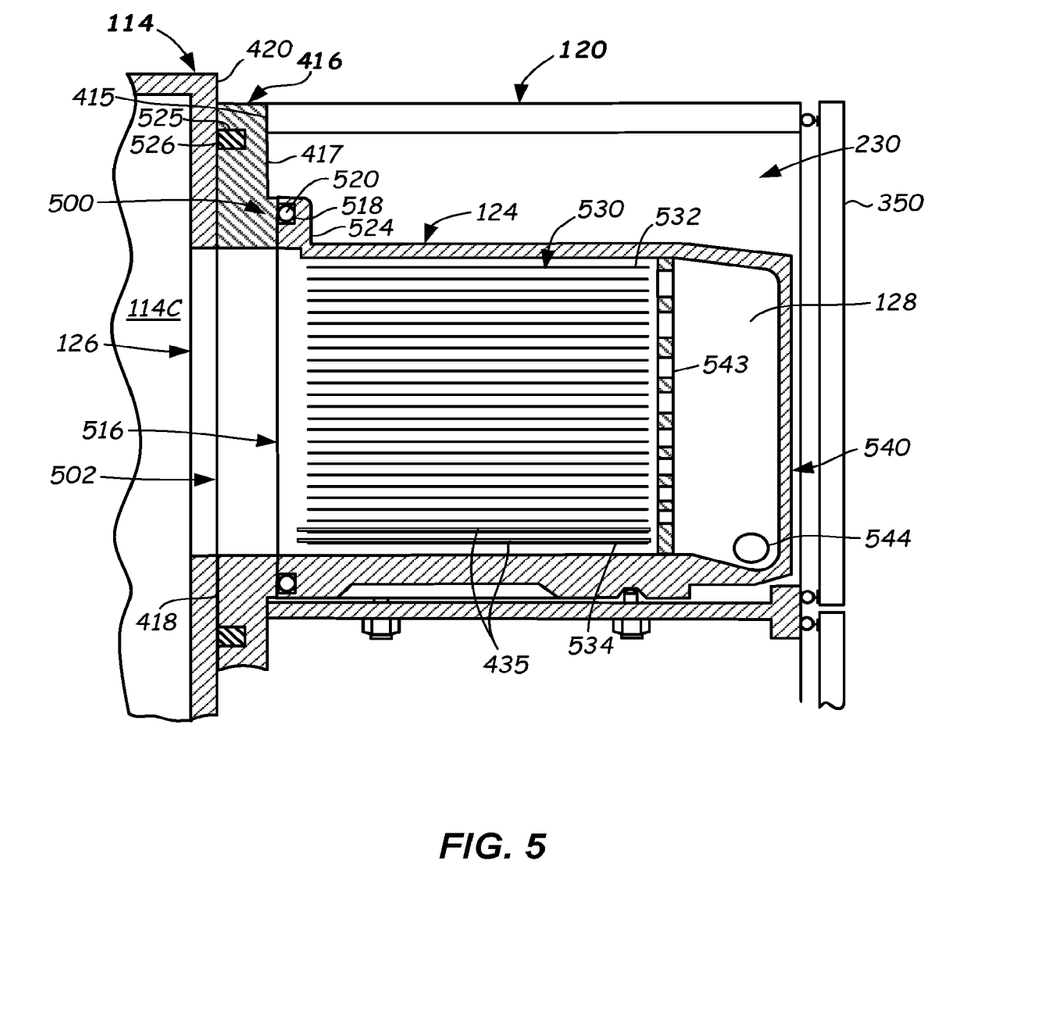
FIG. 5 illustrates a cross-sectional side view of an interface between the EFEM body and a side storage pod having a side storage container located therein according to one or more embodiments of the disclosure.

Additional reference is now made to FIG. 5, which illustrates a side, cross-sectional view of the first side storage container 124. The second side storage container 224 (FIG. 2) may be substantially similar or identical to the first side storage container 124 and configured to seal against an interface portion 500 of panel 416. The first side storage container 124 may have a pod opening 516 that is located adjacent a panel opening 502 of panel 416, which is located adjacent an interface opening 504 of EFEM 114, to form a single opening into the interior of the first side storage container 124. The panel opening 502 may be the same approximate size as the pod opening 516, for example. A pod recess 518 may be formed in an upper flange 524 of side storage container 124 and may extend around the periphery of the pod opening 516. A pod seal 520 may be received within the pod recess 518. The pod seal 520 prevents gas from leaking past the interface portion 500 of the panel 416. In some embodiments, the pod seal 520 may be a pliable material, such as an elastomer-based material, that contacts the pod recess 518 and the interface portion 500. In some embodiments, the pod seal 520 is a pliable tube that may deform to form a seal between the pod recess 518 and the interface portion 500. Other types of seals may be used to seal the first side storage container 124 and the interface portion 500.

The second side 418 of the panel 416 may have a panel recess 525 formed therein that extends around the periphery of the panel opening 502. A panel seal 526 may be received within the panel recess 525 to prevent the exchange of gas between the panel 416 and the surface 420 of the side wall of the body 114B of the EFEM 114. In some embodiments, the panel seal 526 may be a flat seal and may be made of ethylene propylene diene monomer (EPDM) rubber or another suitable sealing material. In some embodiments, the panel seal 526 may be about 10-12 mm deep and have a compression of about 4-6 mm. Other types of sealing mechanisms and materials may be used to form a seal between the surface 420 and the panel 416.

The interior of the first side storage container 124 may include a plurality of substrate holders 530 configured to support substrates 435 thereon. The substrate holders 530 may be vertically-stacked shelves formed onto the lateral sides of the first side storage container 124 and may include a top substrate holder 532 and a bottom substrate holder 534. The substrate holders 530 may be spaced a distance from each other that enables gas flow around (e.g., above and below) substrates 435 received by and supported on the substrate holders 530 and allows access by the end effector of the robot 117. Specifically, purge gas entering the interior of the first side storage container 124 from the EFEM chamber 114C (FIG. 1) by way of the panel opening 502, the interface opening 126, and the pod opening 516 may flow around and/or across the substrates 435 received on the substrate holders 530. Accordingly, the substrates 435 are maintained at desired environmental conditions, such as those present in the EFEM chamber 114C, but also at a desired target purge gas flow rate in the first side storage container 124.

A rear portion 540 of the first side storage container 124 may include openings 543 that fluidly couple the interior of the first side storage container 124 with the exhaust plenum 128. The exhaust plenum 128 may be configured to provide the above-described gas flow around the substrates 435 received on the substrate holders 530. In some embodiments, the exhaust plenum 128 may have a height that extends vertically between the top substrate holder 532 and the bottom substrate holder 534. In one or more embodiments, the exhaust duct 128 may have a width that is approximately the width of the substrates 435. For example, the width of exhaust duct 128 may be about 250 mm to 350 mm for a 300 mm wafer. The exhaust duct 128 may include an exhaust port 544 configured to be coupled to the first exhaust conduit 132 (FIG. 4).

Figure 6:
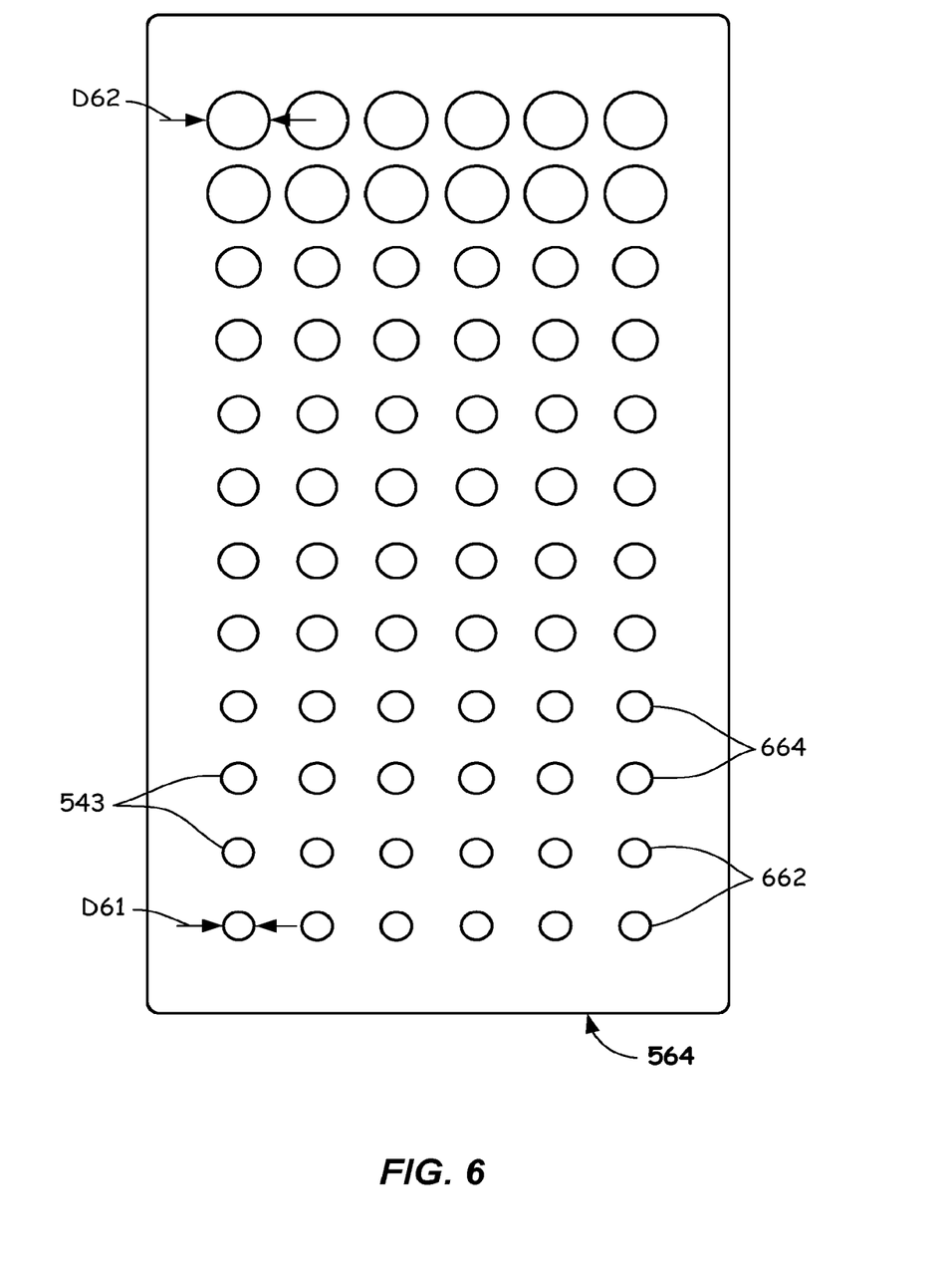
FIG. 6 illustrates a schematic diagram of an exhaust baffle according to one or more embodiments of the disclosure.

In some embodiments, the openings 543 may be in an exhaust baffle 564 may be in the purge gas flow path between the substrates 435 and the exhaust plenum 128. Reference is made to FIG. 6, which illustrates a front elevation view of an example embodiment of the exhaust baffle 564. Other exhaust baffle configurations may be used. The exhaust baffle 564 may include a plurality of round holes comprising the openings 543 (a few labeled) that aid in balancing purge gas flow through the first side storage container 124. In some embodiments, the holes 543 may have small diameters D61 at the bottom of the exhaust baffle 564 and large diameters D62 toward the top of the exhaust baffle 564. The holes 543 with the smaller diameters D61 may be proximate the exhaust port 544 to balance the gas flow. For example, the larger diameters D62 may be between about 15 mm and 17 mm in some embodiments. The smaller diameter holes may range in diameter D61 from about 7 mm to about 9 mm in some embodiments. Other hole diameters and/or hole arrangements and patterns may be used.

In the embodiment of FIG. 6, the holes 543 may be arranged as a two-dimensional array wherein the diameters of the holes 543 progressively decrease from the top of the exhaust baffle 564 toward the bottom of the exhaust baffle 564. In some embodiments, adjacent pairs of rows of holes 543 have the same diameters. For example, a first pair of rows 662 may have holes 543 having a first diameter and a second pair of rows 664 may have holes 543 having a second larger diameter.

Figure 7:
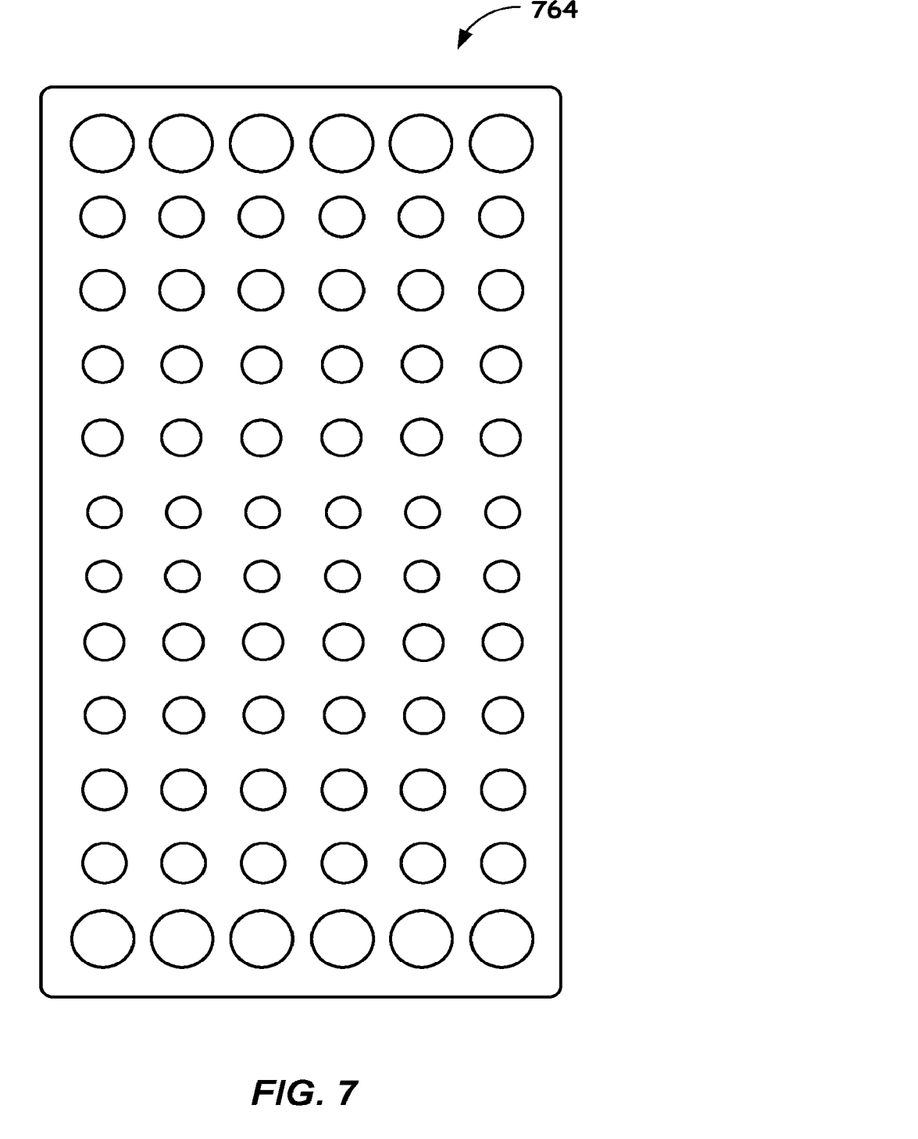
FIG. 7 illustrates a schematic diagram of another exhaust baffle according to one or more embodiments of the disclosure.

FIG. 7 illustrates another embodiment of an exhaust baffle 764 that may be used in side storage containers where the exhaust port 544 is located at a height of about half the vertical distance of the exhaust plenum 128 of the side storage pod 120. As shown in FIG. 7, the holes with smaller diameters are located proximate the location of the exhaust port 544, which balances the purge gas flow through the side storage pod.

The exhaust baffle 564 may substantially balance the purge gas flow, so that all substrates on the substrate holders 530 are exposed to approximately the same purge gas flow (e.g., within 25% of the flow of each other or less, such as 15% or less different).

Gas flow through the interior of the first side storage container 124 enters the pod opening 516, passes over and/or around the substrates 435 supported on the substrate holders 530, flows through the exhaust baffle 564, enters the exhaust plenum 128, and is exhausted via the exhaust port 544. The purge gas flow configuration enables the substrates 435 received in the substrate holders 530 to be in the same environmental conditions as the EFEM 114, yet at a higher flow rate.

As shown in FIGS. 1 and 2, exhausted purge gas from the exhaust conduits 132, 134 enters the pod plenum 240 (FIG. 2) where it may be heated by the heater 250. The exhaust gas can further be filtered by the filter 248 to remove certain chemicals as described above. The supplemental fan 141 forces the exhaust gas into the duct 129 in concert with fan 264 to recirculate the purge gas back into the upper plenum 262 of the EFEM 114 as described above.

The foregoing description discloses example embodiments of the disclosure. Modifications of the above-disclosed apparatus, assemblies, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. A side storage pod, comprising:
   one or more interior chambers;
   one or more side storage containers located in the one or more interior chambers, each of the one or more side storage containers configured to receive one or more substrates, each of the one or more side storage containers further comprising:
      an opening configured to be located adjacent an opening of a body of an equipment front end module; and
      an exhaust port configured to exhaust gas entering the opening;
   a pod plenum; and
   an exhaust conduit coupled between the exhaust port and the pod plenum.

2. The side storage pod of claim 1, further comprising a chemical filter located proximate the pod plenum.

3. The side storage pod of claim 1, further comprising the pod plenum configured to be couplable to a return duct.

4. The side storage pod of claim 1, further comprising a heater proximate to the pod plenum, the heater configured to heat purge gas passing through the pod plenum.

5. The side storage pod of claim 1, further comprising a supplemental fan coupled to the pod plenum and configured to flow exhaust gas into a return duct.

6. The side storage pod of claim 5, wherein the supplemental fan is located in the side storage pod.

7. The side storage pod of claim 1 further comprising an exhaust baffle located in the one or more side storage containers between the opening and the exhaust port.

8. The side storage pod of claim 7 wherein the exhaust baffle is located between the opening and an exhaust plenum containing the exhaust port.

9. The side storage pod of claim 1, further comprising one or more sensors located along an exhaust flow path from the one or more side storage containers.

10. The side storage pod of claim 9, wherein the one or more sensors comprise a flow sensor or a pressure sensor.

11. The side storage pod of claim 1, comprising a supplemental fan comprising a variable speed fan configured to achieve a desired flow rate through the one or more side storage containers.

12. An electronic device processing assembly, comprising:
   an equipment front end module including an equipment front end module chamber having one or more interface openings;
   one or more side storage pods attached to a body of the equipment front end module, the one or more side storage pods comprising:
      one or more interior chambers;
      one or more side storage containers located in the one or more interior chambers, each of the one or more side storage containers configured to receive one or more substrates from the equipment front end module chamber, each of the one or more side storage containers further comprising:
    an opening located adjacent one of the interface openings of the equipment front end module; and
    an exhaust port configured to exhaust gas entering the opening;
a pod plenum; and
an exhaust conduit coupled between the exhaust port and the pod plenum.

13. The electronic device processing assembly of claim 12, further comprising a chemical filter located proximate the pod plenum.

14. The electronic device processing assembly of claim 12, further comprising a heater proximate the pod plenum, the heater configured to heat purge gas flowing through the pod plenum.

15. The electronic device processing assembly of claim 12, further comprising a supplemental fan coupled to the pod plenum and configured to flow exhaust gas into a return duct extending to an upper plenum of the equipment front end module.

16. The electronic device processing assembly of claim 15, wherein the supplemental fan is located in the side storage pod.

17. The electronic device processing assembly of claim 12 further comprising an exhaust baffle located in the one or more side storage containers between the opening and the exhaust port.

18. A method of operating an equipment front end module, comprising:
    flowing purge gas from an upper plenum to an equipment front end module chamber and into an interior chamber of a side storage pod, the interior chamber comprising a side storage container within the side storage pod; and
    exhausting purge gas from the side storage container through a return duct that couples the side storage pod of the side storage container to the upper plenum of the equipment front end module.

19. The method of operating an equipment front end module of claim 18, further comprising exhausting purge gas from the equipment front end module chamber through the return duct.

20. The method of operating an equipment front end module of claim 18, further comprising flowing the exhausted purge gas from the side storage container through a chemical filter to generate filtered gas.

* * * * *